United States Patent
Byun et al.

(10) Patent No.: US 6,933,247 B2
(45) Date of Patent: Aug. 23, 2005

(54) METHOD FOR FORMING A MINUTE PATTERN AND METHOD FOR MANUFACTURING A SEMICONDUCTOR DEVICE USING THE SAME

(75) Inventors: Sung-Hwan Byun, Incheon-si (KR); Dae-Youp Lee, Gunpo-si (KR); Bong-Cheol Kim, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/776,122

(22) Filed: Feb. 11, 2004

(65) Prior Publication Data

US 2004/0185382 A1 Sep. 23, 2004

(30) Foreign Application Priority Data

Mar. 17, 2003 (KR) ................................ 10-2003-0016434

(51) Int. Cl.[7] ........................ H01L 21/31; H01L 31/469
(52) U.S. Cl. ...................... 438/781; 430/311; 430/313; 438/725; 438/780; 438/789; 438/949
(58) Field of Search ................................ 430/197, 296, 430/311, 313, 325, 326, 330, 331, 967; 438/689, 702, 706, 712, 725, 780, 781, 789, 790, 795, 948, 949

(56) References Cited

U.S. PATENT DOCUMENTS

2004/0106067 A1 * 6/2004 Lin et al. .................... 430/311

FOREIGN PATENT DOCUMENTS

| EP | 0825492 A1 * | 2/1998 | ............. G03F/7/40 |
| JP | 10083087 | 3/1998 | ............. G03F/7/20 |
| KR | 01-76552 | 8/2001 | ........... H01L/21/28 |

* cited by examiner

Primary Examiner—Asok Kumar Sarkar
(74) Attorney, Agent, or Firm—Mills & Onello LLP

(57) ABSTRACT

A method for forming a minute pattern includes forming a mask layer on an object being patterned. The mask layer is patterned to form a first mask pattern having a first width larger than a predetermined width. The first mask pattern is thermally treated to form a second mask pattern having a second width smaller than the first width. A polymer layer is formed on the second mask pattern. The polymer layer reacts with the second mask pattern to form a hardened layer on a boundary surface between the polymer layer and the second mask pattern, thereby forming a third mask pattern having a third width substantially identical to the predetermined width. The limits of the present photolithography equipment are overcome. Also, a semiconductor device having a CD of below about 100 nm is manufactured.

18 Claims, 9 Drawing Sheets

METHOD FOR FORMING A MINUTE PATTERN AND METHOD FOR MANUFACTURING A SEMICONDUCTOR DEVICE USING THE SAME

CROSS REFERENCE TO RELATED APPLICATION

This application claims priority under 35 USC § 119 to Korean Patent Application 2003-16434 filed on Mar. 17, 2003, the contents of which are herein incorporated by reference in their entirety for all purposes.

BACKGROUND OF THE INVENTION

1. Field of the Invention

The present invention relates to a method of forming a minute pattern, and a method of manufacturing a semiconductor device using the same. More particularly, the present invention relates to a method for forming a minute pattern having a nano-size to form a contact hole or a metal wiring that has a size of below about 100 nm, and to a method of manufacturing a semiconductor device using the same.

2. Description of the Related Art

Generally, in semiconductor fabricating processes, a photolithography process includes transcribing a master mask pattern into a photoresist layer on an insulating layer or a conductive layer formed on a substrate. The photoresist layer is patterned to form a photoresist pattern used as a work mask.

In typical photolithography, the photoresist layer is formed on a target layer being patterned such as the insulating layer or the conductive layer. Light such as X-ray or ultraviolet ray is irradiated into the photoresist layer so that the photoresist layer is divided into a high soluble region and a low soluble region. A portion of photoresist layer positioned at the high soluble region is removed to form the photoresist pattern. A target layer pattern for forming an active region, a wiring or a contact hole is formed using the photoresist pattern as the mask.

Photolithography technology has substantially developed, resulting in semiconductor devices with a dynamic random access memory (DRAM) being manufactured in large quantities. The integration degree of the DRAM has increased by about four times in a cycle of about three years. Also, technologies of other memories or logics have constantly developed. According to these trends, the design rule of semiconductor devices has been changed approximately 0.8 $\mu$m of 4M DRAM into approximately 0.18 $\mu$m of 1G DRAM. To meet the design rule, non-optical lithography technology has been developed.

However, although various kinds of technologies are combined to enhance resolution of a deep ultra violet (DUV) photolithography technology, a minute pattern having a size of below approximately 0.1 $\mu$m may be difficult to achieve. To form the minute pattern, diverse technologies, such as a technology using a new light source, have been attempted.

The upgrade of semiconductor fabricating equipment may be a relatively simple approach to overcoming limits of critical dimensions (CD) to form the minute pattern. However, when new equipment is introduced, cost for manufacturing the semiconductor device may increase, and also the processing conditions of the new equipment may have to be accommodated, resulting in increased manufacturing cost.

To overcome resolution limits of the photolithography equipment without introducing new equipment, a thermal flowing process (TFP) and a chemical attached process (CAP) have been introduced.

The TFP includes forming an oxide layer and a photoresist pattern successively on a substrate. The photoresist pattern is thermally treated to form a flowing photoresist pattern. The space of the flowing photoresist pattern is reduced. The TFP may reduce the CD size of the photoresist pattern by controlling processing temperature and time according to characteristics of the photoresist pattern, which includes a photosensitive material. Korean Patent No. 327436 discloses a method of forming minute contact holes using the TPF whereas Japanese Patent Laid-Open Publication No. 1998-83087 provides a method of forming a pattern using the CAP process.

FIGS. 1A and 1B are partially cross sectional views illustrating the method for forming a minute contact according to the above-mentioned Korean Patent.

Referring to FIG. 1A, an insulating layer 12 is formed on a substrate 10. A photosensitive material is coated on the insulating layer 12 by a spin method. The photosensitive material is baked to form a photoresist layer. The photoresist layer is exposed and developed to form a photoresist pattern 14 on the insulating layer.

Referring to FIG. 1B, the photoresist pattern 14 is thermally treated to form a flowing photoresist pattern. The space of the flowing photoresist pattern is gradually reduced. The flowing photoresist pattern may have a curved profile as shown.

However, since the conventional TFP method is fundamentally dependent on the resolution of the photolithography equipment, it is difficult and perhaps impossible to achieve a prescribed resolution. The thermal flowing at a high temperature may deteriorate the uniformity of the photoresist pattern. That is, the fluidity of the photoresist pattern increases in proportion to rising temperature. The photoresist pattern may flow like liquid at a temperature above a glass transition temperature to block the minute pattern, such as the contact hole.

FIG. 2 is a graph illustrating transitions of CD between a DUV photoresist and an i-line photoresist in accordance with temperature variations in the conventional TFP. In FIG. 2, a solid line indicates the DUV photoresist, and a dotted line indicates the i-line ($\lambda$=365 nm) photoresist.

Referring to FIG. 2, the CD of the photoresist pattern is constant as temperature is maintained below the glass transition temperature. The CD of the photoresist pattern slowly decreases as the temperature passes just above the glass transition temperature. The CD of the photoresist pattern rapidly decreases as the temperature passes through a point of high temperature above the glass transition temperature.

This means that the property of the photoresist may be rapidly varied at the high temperature above the glass transition temperature. As a result, the TFP may be sensitively dependent on the variations of the high temperature. Since the size of the photoresist pattern may be greatly changed by tiny variations of the temperature, the CD of the photoresist pattern is not easily controlled with variations of the temperature. As shown in FIG. 2, the CD of the DUV photoresist is lowered more rapidly than that of i-line photoresist above the glass transition temperature, that is, the CD of the DUV photoresist is more difficult to control.

FIGS. 3A to 3E are cross sectional views illustrating a method of forming a pattern using a CAP process in accordance with the above-mentioned Japanese Patent Laid Open Publication. Referring to FIG. 3A, an insulating layer 32 is formed on a substrate 30. A photosensitive material is coated on the insulating layer 32 by a spin coating. The photosensitive material is baked at a temperature of about 90 degrees C. to about 110 degrees C. for about 60 seconds to about 100 seconds. The moisture of the photosensitive material is evaporated to form a solid photosensitive material. As a result, a photoresist layer 34 having the solid photosensitive material is formed on the insulating layer 32. The photoresist layer 34 is exposed to an ultra violet ray or an X-ray to divide the layer 34 into an exposure region and a non-exposure region.

Referring to FIG. 3B, the exposure region or the non-exposure region of the photoresist layer 34 is selectively removed to form a photoresist pattern 34a. The space 36 of the photoresist pattern 34a has width a corresponding to a master mask. The width a is limited according to the resolution limit of the equipment.

Referring to FIG. 3C, a hardening material 38 is coated on the photoresist pattern 34a and the insulating layer 32.

Referring to FIG. 3D, the hardening material 38 reacts with the photosensitive material of the photoresist pattern. 34a at boundary surfaces between the hardening material 38 and the photoresist pattern. 34a so that a new material 40 is created. The created material 40 develops between the photoresist pattern 34a and the hardening material. The developed material is connected together to form a hardened layer 42.

Referring to FIG. 3E, the space 36a of the photoresist pattern 34a has a width b shorter than the width A of the space 36a of the photoresist pattern 34a in FIG. 3B due to a thickness of the hardened layer 42. Accordingly, the CD of the photoresist pattern 34a is reduced. The remaining hardening material may be removed by an alkaline solution. The insulating layer 32 is dry etched using the photoresist pattern 34a and the hardened layer 42 as a mask to form a contact hole 32a in the insulating layer 32.

As described above, in the conventional CAP, the hardening material such as a water-soluble polymer is coated on the photoresist pattern. The hardening material reacts with the photosensitive material to form the hardened layer. Accordingly, the CD of the photoresist pattern may be reduced due to the thickness of the hardened layer.

The CAP may be little influenced by the resolution limit of the equipment in contrast to the TFP. Also, because the CAP having the amount attached varying in accordance with the photoresist material and the water-soluble polymer on the photoresist material is stable, the CAP has been widely used for overcoming the resolution limits of the present equipment without introducing new equipment.

However, the CAP may have a limit of the thickness of the hardened layer. When the hardened layer is attached above the limited thickness, the CAP may be unstable and may be not employed in the semiconductor fabricating processes. Furthermore, since the CAP may be dependent on the shape and the density of the photoresist pattern, etc., the CAP may be not stably employed in the semiconductor fabricating processes.

SUMMARY OF THE INVENTION

It is a first feature of the invention to provide a method for forming a minute pattern, which can overcome a resolution limit of the photolithography equipment to form a minute pattern of desired dimensions.

It is a second feature of the invention to provide a method for manufacturing a semiconductor device having a minute contact hole or a wiring using the method for forming a minute pattern.

In accordance with one aspect of the invention, to form a minute pattern according to the invention, a mask layer is formed on an object being patterned. The mask layer is patterned to form a first mask pattern having a first width larger than a predetermined width. The first mask pattern is thermally treated to form a second mask pattern having a second width smaller than the first width. A polymer layer is formed on the second mask pattern. The polymer layer reacts with the second mask pattern to form a third mask pattern having a third width substantially identical to the predetermined width.

When the polymer layer reacts with the second mask patter, a hardened layer is formed on a boundary surface between the polymer layer and the second mask pattern, thereby forming the third mask pattern.

In one embodiment wherein the mask layer is formed on an insulating layer or a conductive layer formed on a substrate, and a pattern is formed on the substrate by etching the insulating layer or the conductive layer using the third mask pattern. The pattern can include a hole or a wiring.

In one embodiment, thermally treating the first mask pattern is performed at a temperature of about 140 degrees C. to about 180 degrees C.

In one embodiment, a difference between the first width and the second width is below about 100 nm.

The polymer layer can include a water-soluble polymer. The water-soluble polymer can include a material selected from the group consisting of a melanin based water-soluble polymer, a polyvinyl-based water-soluble polymer and a fluorine based water-soluble polymer. In one embodiment, the hardened layer is formed at a boundary between the polymer layer and the second mask pattern by reacting the polymer layer with the second mask pattern at a temperature of about 110 degrees C. to about 150 degrees C. Prior to reacting the polymer layer with the second mask pattern, the second mask pattern having the polymer layer can be exposed to a deep ultra violet ray, wherein a remaining polymer layer is removed by using deionized water.

In one embodiment, the second mask pattern is thermally treated at a temperature of about 90 degrees C. to about 130 degrees C.

In one embodiment, the second mask pattern is exposed.

In one embodiment, the mask layer includes a photoresist layer.

In accordance with a method for manufacturing a semiconductor device according to the invention, a photoresist layer is formed on a target layer formed on a substrate. The photoresist layer is patterned to form a first photoresist pattern having a first width larger than a predetermined width. The first photoresist pattern is thermally treated to form a second photoresist pattern having a second width shorter than the first width. A polymer layer is formed on the second photoresist pattern. The polymer layer reacts with the second photoresist pattern to form a third photoresist pattern having a third width substantially identical to the predetermined width. The target layer is etched using the third photoresist pattern as a mask to form a target layer pattern.

The photoresist layer can be patterned to form the first photoresist pattern by thermally treating the photoresist layer. The target layer pattern can include a hole or a wiring.

The target layer can include an insulating layer or a conductive layer.

Thermally treating the first photoresist pattern can be performed at a temperature of about 140 degrees C. to about 180 degrees C.

The difference between the first width and the second width can be below about 100 nm.

The polymer layer can include a material selected from the group consisting of a melanin based water-soluble polymer, a polyvinyl-based water-soluble polymer and a fluorine based water-soluble polymer.

In one embodiment, a hardened layer is formed at a boundary between the polymer layer and the second photoresist pattern by reacting the polymer layer with the second photoresist pattern at a temperature of about 110 degrees C. to about 150 degrees C. In one embodiment, prior to reacting the polymer layer with the second photoresist pattern, the second photoresist pattern having the polymer layer can be exposed to a deep ultra violet ray, wherein a remaining polymer layer after reacting with the second photoresist pattern is removed using deionized water.

In one embodiment, the second photoresist pattern is thermally treated at a temperature of about 90 degrees C. to about 130 degrees C.

According to the invention, a minute pattern for forming a contact hole or wiring having desired dimensions is formed by using present photolithography equipment without introducing new equipment. Furthermore, since the limits of the TFP and the CAP are overcome by the method of the invention, the photoresist pattern having a minute size of below approximately 100 nm is formed, and also the contact hole or the wiring is formed using the minute photoresist pattern.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

FIGS. 4A to 4G are cross-sectional views illustrating an approach to forming a minute pattern and for manufacturing a semiconductor device according to embodiments of the invention. FIGS. 4A to 4G show forming a contact hole on a substrate. Hereinafter, detailed descriptions and illustrations concerning source/drain regions and a gate structure exposed from the contact hole are omitted as being known in the art.

Figure 1A:
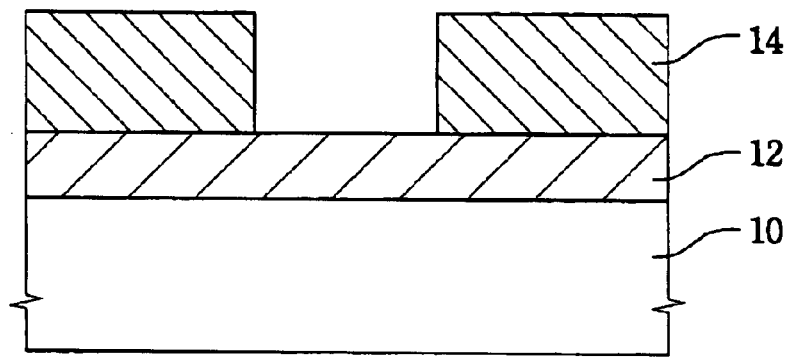
FIGS. 1A and 1B are partially cross-sectional views illustrating a conventional TFP.
Figure 1B:
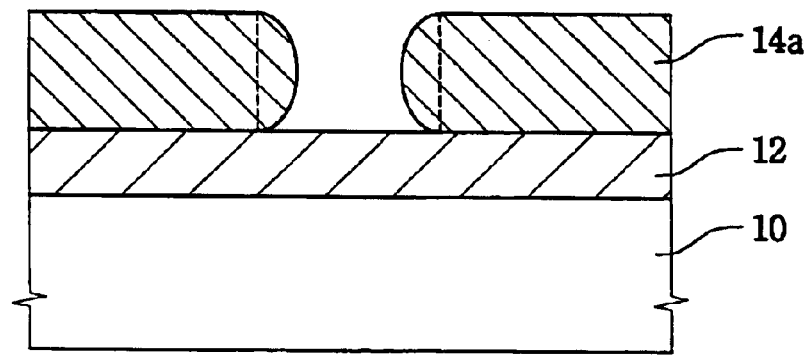
Figure 2:
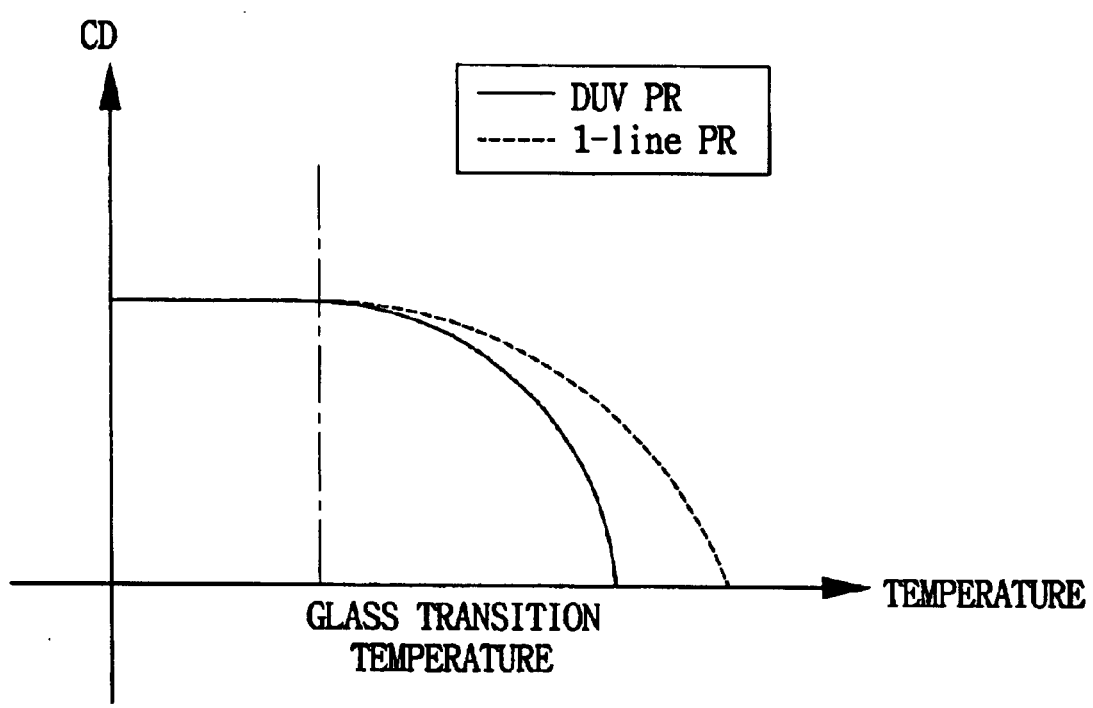
FIG. 2 is a graph illustrating transitions of CD between a DUV photoresist and an i-line photoresist in accordance with temperature variations in the conventional TFP.
Figure 3A:
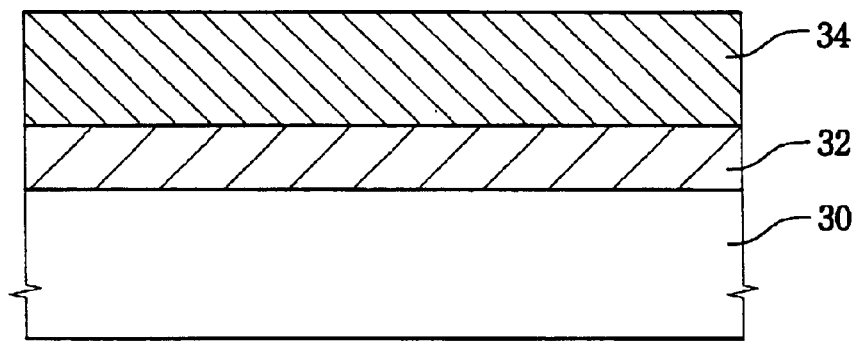
FIGS. 3A to 3E are cross-sectional views illustrating a conventional CAP.
Figure 3B:
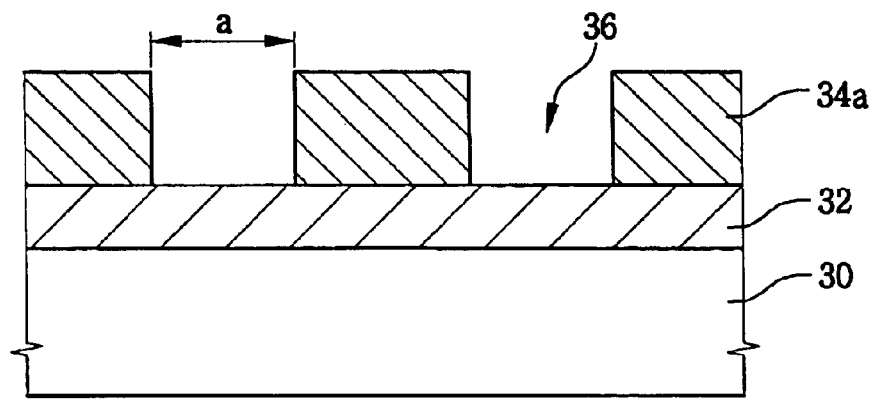
Figure 3C:
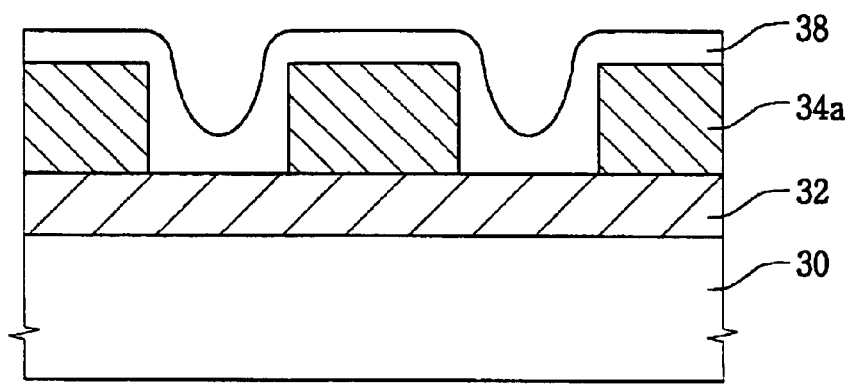
Figure 3D:
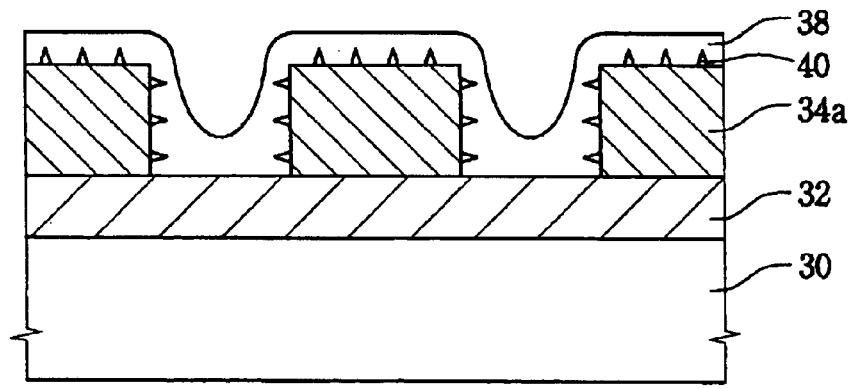
Figure 3E:
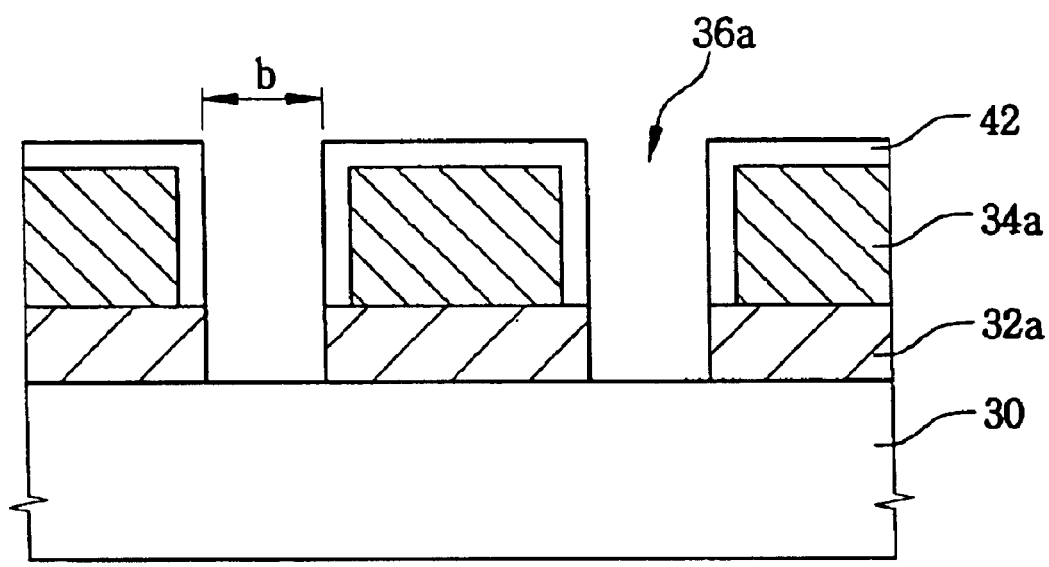
Figure 4A:
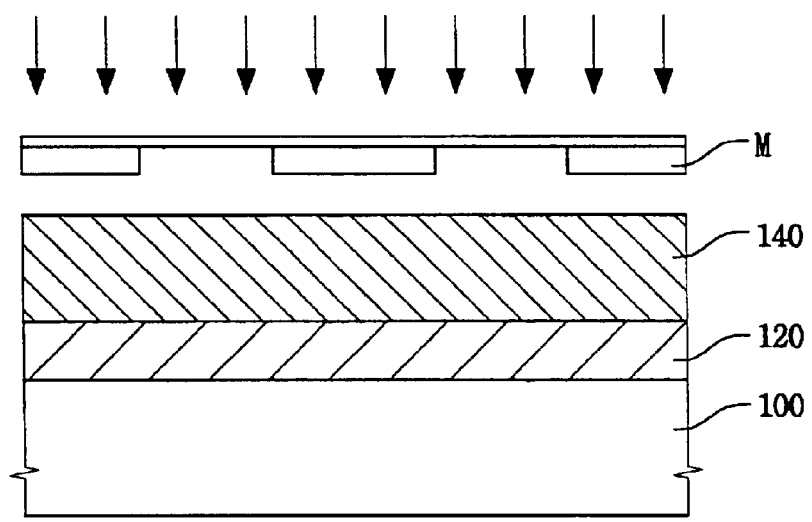
FIGS. 4A to 4G are cross-sectional views illustrating a method for forming a minute pattern and a method for manufacturing a semiconductor device according to embodiments of the invention.

Referring to FIG. 4A, an insulating layer 120 corresponding to an insulating interlayer is formed on a substrate 100 having a gate structure and source/drain regions formed thereon. The insulating layer 120 is formed using oxide or nitride by a chemical vapor deposition (CVD) process.

A photosensitive material (not shown) is coated on the insulating layer 120 by a spin coating process. The photosensitive material may include a sensitizer, a resin and a solvent. Subsequent processes for enhancing adhesion strength between the photosensitive material and the insulating layer 120 may be performed.

A dehydration baking process may be performed on the substrate 100. The dehydration baking process includes a step of heating the substrate 100 having the insulating layer 120 at a temperature of about 400 degrees C. for about 1 minute to about 2 minutes before coating the photosensitive material on the insulating layer 120. As a result, moisture on the substrate 100 and the insulating layer 120 is removed.

Alternatively, a process using hexamethyldisilzane (HMDS) may be performed on the substrate 100. That is, HMDS is coated on the substrate 100 and the insulating layer 120 at room temperature or at a temperature of about 150 degrees C. for about one minute to about two minutes. The material included in the insulating layer 120 reacts with oxygen by coating HMDS to enhance the adhesion strength between the insulating layer 120 and a photoresist layer formed on the insulating layer 120.

The substrate 100 having the insulating layer 120 is heated at a temperature of about 90 degrees C. to 110 degrees C. for about 1 minute to about 2 minutes. This heating process is called as a pre-baking process. The solvent includes by about 80% to about 90% of fluidic photosensitive material is evaporated so that the photoresist layer 140 having remaining solid components is formed on the insulating layer 120. The photoresist layer 140 has a thickness of about 400 nm to about 1,600 nm.

A mask M for transcribing a desired pattern onto the photoresist layer 140 is disposed above the substrate 100 having the photoresist layer 140 formed thereon. Light having a wavelength $\lambda$ of g-line ($\lambda$=436 nm), i-line ($\lambda$=365 nm) or KrF ($\lambda$=248 nm) is irradiated into the photoresist layer 140 through the mask M. As a result, the desired pattern of the mask M is transcribed into the photoresist layer 140. Here, the mask M may include a binary intensity mask (BIM) or a phase shift mask (PSM).

Figure 4B:
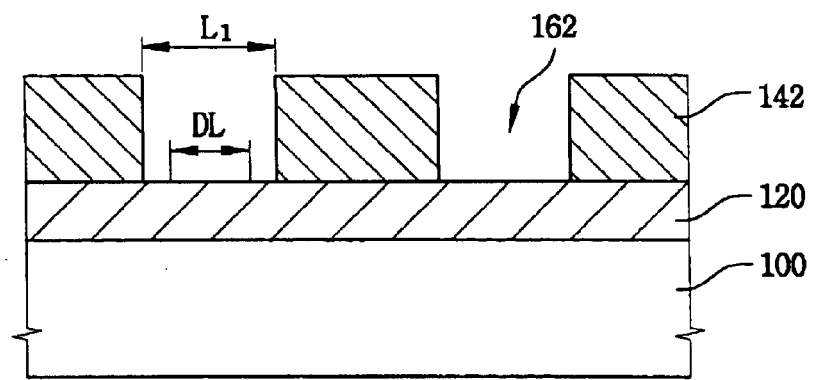

Referring to FIG. 4B, a post exposure baking (PEB) process is performed on the substrate 100 having the exposed photoresist layer 140 at a temperature of about 90 degrees C. to about 130 degrees C. for about 1 minute to about 2 minutes. Although acid ions ($H^+$) are generated from the exposed DUV photoresist layer 140, the PEB process may amplify or diffuse the acid ions so that the resolution of the exposed region of the photoresist layer 140 may be greatly different from that of the non-exposed region of the photoresist layer 140.

The photoresist layer 140 is developed using an alkaline solution including tetramethyl-ammonium hydroxide (TMAH) at room temperature or at a temperature of about 150 degrees C. for about 1 minute to about 2 minutes. The photoresist layer 140 is selectively removed in accordance with chemical reaction between the exposed region and the non-exposed region of the photoresist layer 140 having resolutions different from each other.

The photoresist layer 140 is developed to form a first photoresist pattern 142 having a first width L1. In this embodiment, a contact hole or a wiring having a predetermined width DL on the insulating layer 120 is formed. The first width L1 of the first photoresist pattern 142 is larger than the predetermined width DL. The first width L1 corresponds to the predetermined width DL by successive processes for reducing the first width L1.

Figure 4C:
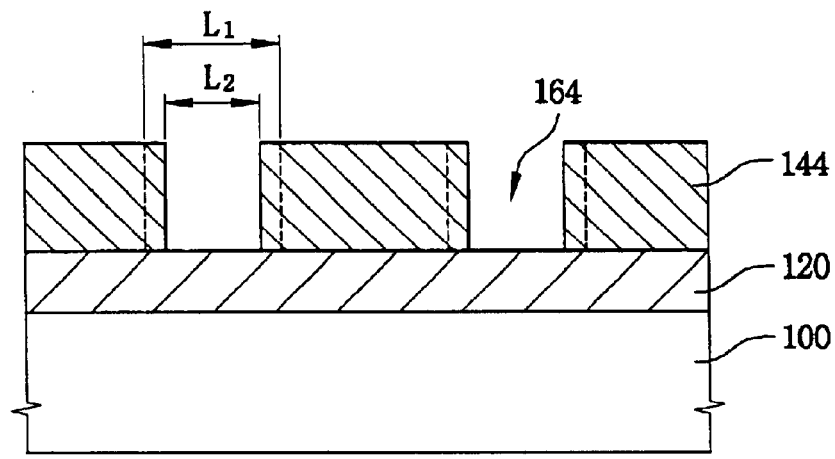

Referring to FIG. 4C, the substrate 100 having the first photoresist pattern 142 is thermally treated at a temperature of about 140 degrees C. to about 180 degrees C. This process is called as a thermal flowing process. The first width L1 of the first photoresist pattern 142 is gradually reduced through the thermal flowing process to thereby form a second photoresist pattern 144 having a second width L2 shorter than the first width L1.

The difference between the first width L1 and the second width L2 may be below about 100 nm. When the difference between the first width L1 and the second width L2 is above about 100 nm, the substrate 100 having the first photoresist pattern 142 may be heated at a high temperature for a long time to reduce the first width L1 through the thermal flowing process. Additionally, reduction of the first width L1 may be difficult for a stable control under the above conditions.

As described above, the second photoresist pattern 144 is formed through the thermal flowing process. Since the first width L1 is changed into the second width L2, the second photoresist pattern 144 has the second width L2 smaller than the first width L1.

The second photoresist pattern 144 is exposed without an additional mask. Acid ions contained in the second photoresist pattern 144 are amplified or diffused. The acid ions may be diffused by a heat to react with material existing in a boundary of the second photoresist pattern 144, and the first width L1 of first photoresist pattern 144 may be additionally reduced by the reaction.

Alternatively, a PEB process may be performed on the substrate 100 having the second photoresist pattern 144 at a temperature of about 90 degrees C. to about 130 degrees C. for about 1 minute to about 2 minutes. The acid ions in the second photoresist pattern 144 may be amplified or diffused by the PEB process.

To prevent the second width L2 of the second photoresist pattern 144 from rapidly varying at a high temperature, the second width L2 of the second photoresist pattern 144 is appropriately reduced. The difference between the first width L1 and the second width L2 may be preferably below about 100 nm.

Figure 4D:
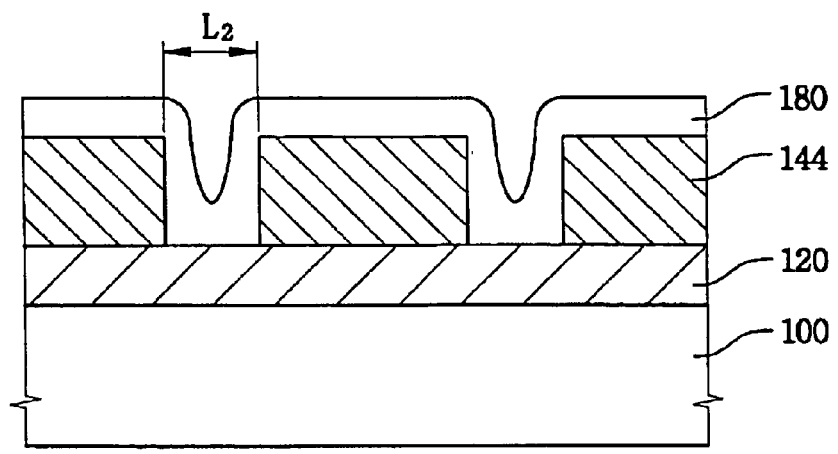

Referring to FIG. 4D, a water-soluble polymer having a hardening material is coated on the second photoresist pattern 144 to form a polymer layer 180. The water-soluble polymer may include a melanin-based water-soluble polymer, a polyvinyl based water-soluble polymer, a fluorine-containing water-soluble polymer, etc.

The water-soluble polymer may have a molecular weight of about 2,000 g/mol to about 10,000 g/mol. The water-soluble polymer may include the melanin based water-soluble polymer having a molecular weight distribution of about 2.0 to about 4.0. The polymer layer 180 having a thickness of about 30 nm to about 100 nm is formed on the second photoresist pattern 144 by a spin coating process.

Here, the second width L2 of the second photoresist pattern 144 is larger than the predetermined width DL. The difference between the second width L2 and the predetermined width DL is compensated through a successive process for forming a hardened layer.

Figure 4E:
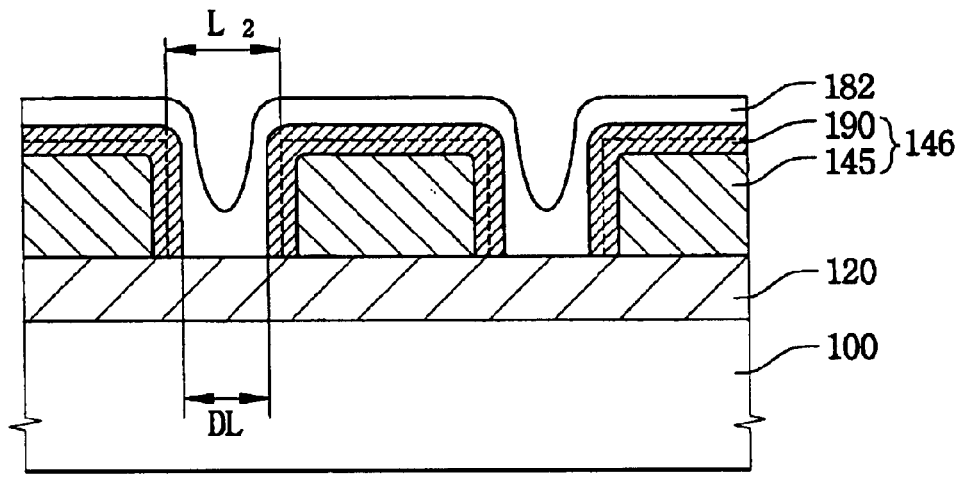

Referring to FIG. 4E, the substrate 100 having the polymer layer 180 is thermally treated at a temperature of about 90 degrees C. to about 150 degrees C. for about 30 seconds to about 150 seconds. The polymer layer 180 reacts with the second photoresist pattern 144 at the boundary between of the polymer layer 180 and the second photoresist pattern 144 to form the hardened layer 190 at this boundary. A non-reacted polymer layer 182 and a non-reacted second photoresist pattern 145 remain on a periphery of the hardened layer 190. The thermal processing conditions concerning the polymer layer 180 may be varied according to the material and the dimensions of the second photoresist pattern 144 and the polymer layer 180.

Figure 4F:
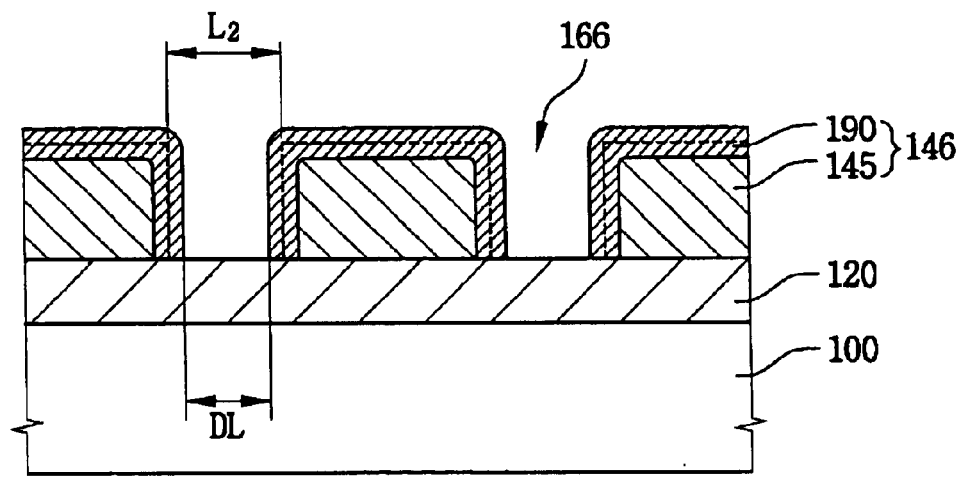

Referring to FIG. 4F, the non-reacted polymer layer 182 is removed using deionized water. As a result, a third photoresist pattern 146 is formed on the substrate 100. The third photoresist pattern 146 includes the non-reacted second photoresist pattern 145 and the hardened layer 190.

Accordingly, the third photoresist pattern 146 has a third width L3 substantially identical to the predetermined width DL. The third width L3 of the third photoresist pattern 146 may be adjusted to substantially correspond to the predetermined width DL.

Figure 4G:
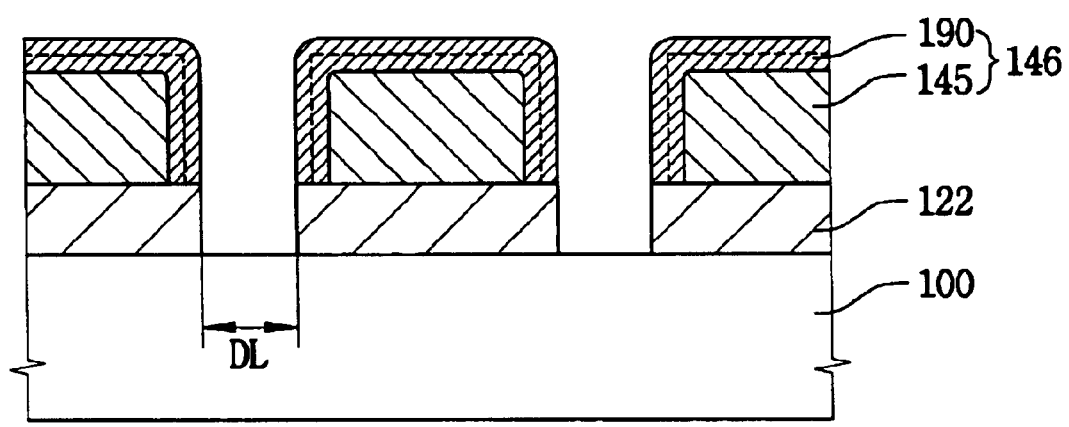

Referring to FIG. 4G, the insulating layer 120 is etched using the third photoresist pattern 146 as a mask to form an insulating layer pattern 122. Alternatively, a dry or a wet etching process may be performed using the third photoresist pattern 146 as the mask. Therefore, a minute pattern for forming the contact hole or the wiring having the predetermined width DL is formed through the etching process.

The third photoresist pattern 146 may be removed through an ashing process, a rinsing process using $H_2SO_4$ and $H_2O_2$ or a stripping process using an organic stripper.

According to the invention, a minute pattern for forming the contact hole or the wiring having the determined width is formed by using the present photolithography equipment without additional introduction of new equipment. Accordingly, a high-integrated semiconductor device is manufactured.

Also, the method according to the invention overcomes the limits of the TFP and the CAP. Therefore, a minute photoresist pattern having the CD of below about 100 nm is formed. The contact hole or the wiring is formed using the minute photoresist pattern.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a minute pattern comprising:
   forming a mask layer;
   patterning the mask layer to form a first mask pattern having a first width larger than a predetermined width;
   thermally treating the first mask pattern to form a second mask pattern having a second width smaller than the first width, wherein the second mask pattern is formed by gradually reducing the first width in response to the thermal treatment, and wherein a difference between the first width and the second width is less than about 100 nm;
   forming a polymer layer on the second mask pattern; and
   reacting the polymer layer with the second mask pattern to form a third mask pattern having a third width substantially identical to the predetermined width.

2. The method for forming a minute pattern of claim 1, wherein the mask layer is formed on an insulating layer or a conductive layer formed on a substrate, and a pattern is formed on the substrate by etching the insulating layer or the conductive layer using the third mask pattern.

3. The method for forming a minute pattern of claim 2, wherein the pattern includes a hole or a wiring.

4. The method for forming a minute pattern of claim 1, wherein thermally treating the first mask pattern is performed at a temperature of about 140 degrees C. to about 180 degrees C.

5. The method for forming a minute pattern of claim 1, wherein the polymer layer includes a water-soluble polymer.

6. The method for forming a minute pattern of claim 5, wherein the water-soluble polymer comprises a material selected from the group consisting of a melanin based water-soluble polymer, a polyvinyl-based water-soluble polymer and a fluorine based water-soluble polymer.

7. The method for forming a minute pattern of claim 5, further comprising forming a hardened layer at a boundary between the polymer layer and the second mask pattern by reacting the polymer layer with the second mask pattern at a temperature of about 110 degrees C. to about 150 degrees C.

8. The method for forming a minute pattern of claim 7, prior to reacting the polymer layer with the second mask pattern, further comprising, prior to reacting the polymer layer with the second mask pattern, exposing the second mask pattern having the polymer layer to a deep ultra violet ray, wherein a remaining polymer layer next to reacting with the second mask pattern is removed by using deionized water.

9. The method for forming a minute pattern of claim 1, further comprising thermally treating the second mask pattern at a temperature of about 90 degrees C. to about 130 degrees C.

10. The method for forming a minute pattern of claim 1, further comprising exposing the second mask pattern.

11. The method for forming a minute pattern of claim 1, wherein the mask layer includes a photoresist layer.

12. A method for manufacturing a semiconductor device comprising:

forming a photoresist layer on a target layer formed on a substrate;

patterning the photoresist layer to form a first photoresist pattern having a first width larger than a predetermined width;

thermally treating the first photoresist pattern to form a second photoresist pattern having a second width smaller than the first width, wherein the second photoresist pattern is formed by gradually reducing the first width in response to the thermal treatment, and wherein a difference between the first width and the second width is less than about 100 nm;

forming a polymer layer on the second photoresist pattern;

reacting the polymer layer with the second photoresist pattern to form a third photoresist pattern having a third width substantially identical to the predetermined width; and etching the target layer using the third photoresist pattern as a mask to form a target layer pattern.

13. The method for manufacturing a semiconductor device of claim 12, wherein the target layer includes an insulating layer or a conductive layer.

14. The method for manufacturing a semiconductor device of claim 12, wherein thermally treating the first photoresist pattern is performed at a temperature of about 140 degrees C. to about 180 degrees C.

15. The method for manufacturing a semiconductor device of claim 12, wherein the polymer layer comprises a material selected from the group consisting of a melanin based water-soluble polymer, a polyvinyl-based water-soluble polymer and a fluorine based water-soluble polymer.

16. The method for manufacturing a semiconductor device of claim 12, further comprising forming a hardened layer at a boundary between the polymer layer and the second photoresist pattern by reacting the polymer layer with the second photoresist pattern at a temperature of about 110 degrees C. to about 150 degrees C.

17. The method for manufacturing a semiconductor device of claim 16, further comprising, prior to reacting the polymer layer with the second photoresist pattern, exposing the second photoresist pattern having the polymer layer to a deep ultra violet ray, wherein a remaining polymer layer after reacting with the second photoresist pattern is removed using a deionized water.

18. The method for manufacturing a semiconductor device of claim 12, further comprising thermally treating the second photoresist pattern at a temperature of about 90 degrees C. to about 130 degrees C.

* * * * *